US007962299B2

(12) United States Patent
Robertson et al.

(10) Patent No.: US 7,962,299 B2
(45) Date of Patent: Jun. 14, 2011

(54) ELECTRICITY METERING

(75) Inventors: Peter Steven Robertson, Nottingham (GB); Ian Robert Browne, Nottingham (GB)

(73) Assignee: One Click (IP) Limited, Nottingham (GB)

(*) Notice: Subject to any disclaimer, the term of this patent is extended or adjusted under 35 U.S.C. 154(b) by 674 days.

(21) Appl. No.: 10/582,375

(22) PCT Filed: Dec. 9, 2004

(86) PCT No.: PCT/GB2004/005173
§ 371 (c)(1),
(2), (4) Date: Dec. 1, 2008

(87) PCT Pub. No.: WO2005/057226
PCT Pub. Date: Jun. 23, 2005

(65) Prior Publication Data
US 2009/0076748 A1    Mar. 19, 2009

(30) Foreign Application Priority Data
Dec. 9, 2003    (GB) .................................... 0328682.0

(51) Int. Cl.
*G06F 19/00* (2011.01)
(52) U.S. Cl. ......................................................... 702/62
(58) Field of Classification Search .................... 702/62, 702/64, 182–185, 188; 324/500
See application file for complete search history.

(56) References Cited

U.S. PATENT DOCUMENTS

| | | | |
|---|---|---|---|
| 4,644,320 A | 2/1987 | Carr et al. | |
| 5,589,764 A | 12/1996 | Lee | |
| 5,635,895 A | 6/1997 | Murr | |
| 6,226,600 B1 | 5/2001 | Rodenberg, III et al. | |
| 2003/0193405 A1 | 10/2003 | Hunt et al. | |
| 2006/0195229 A1* | 8/2006 | Bell et al. ....................... | 700/286 |
| 2007/0156291 A1* | 7/2007 | Curt et al. ...................... | 700/286 |

FOREIGN PATENT DOCUMENTS

| | | |
|---|---|---|
| GB | 2 302 952 | 2/1997 |
| GB | 2302952 | 2/1997 |
| WO | WO 00/33091 | 6/2000 |
| WO | WO0033091 | 6/2000 |
| WO | WO02074309 | 10/2002 |
| WO | WO 03/025878 | 3/2003 |
| WO | WO03025878 | 3/2003 |

OTHER PUBLICATIONS

UK Search report dated Nov. 10, 2004 from GB0328682.0.
International Search Report dated Apr. 5, 2005 from PCT/GB2004/005173.

* cited by examiner

*Primary Examiner* — Edward Raymond
(74) *Attorney, Agent, or Firm* — Ryan Kromholz & Manion, S.C.

(57) ABSTRACT

A power consumption monitoring apparatus, comprising at least one electrical measurement device (210) for generating a signal indicative of the electrical power passing through an electrical power line (300) at the location of the measurement device, and at least one data controller (220) adapted to receive the signal from the measurement device and to convert the signal into a data transmission stream conveying at least one power consumption statistic. The data controller including a transmitter (221) for transmitting the data transmission stream across a communications medium and a display controller (230) including a receiver (231) for receiving the stream from the communications medium, the display controller adapted to convert the stream into one or more data display transmission signals for reception by a variety of display devices (310) to display power consumption statistics.

25 Claims, 2 Drawing Sheets

ELECTRICITY METERING

The present invention relates to electrical power metering and power consumption monitoring.

The modern home has many power consuming devices and appliances, ranging from toasters and kettles to televisions, automatic washing machines and immersion heaters. Each device and appliance consumes electrical power at a different rate and for different lengths of time, with the total power consumption being recorded by an electricity meter (hereinafter referred to as the domestic meter) installed in the home by the utility supplier.

A major disadvantage of domestic meters is that they only display the total power consumption within the home up to the point of inspection and cannot provide power consumption statistics for individual devices or appliances. As a consequence the consumer is not able to monitor the power consumption characteristics of a particular device or appliance or groups of devices or appliances over a prescribed time interval and cannot access historical power usage statistics for a desired period e.g. one week, two weeks, one month or one year etc.

Furthermore, domestic meters are not always easy to interpret, firstly they have to be read, which for modern digital meters can involve cycling through different displays of measurements until the applicable reading is displayed, and then if a cost is desired this must be calculated based on the number of kWh consumed within a given interval. This tends not to be a trivial exercise for the average consumer.

The ability to monitor both total and selected power consumption could greatly benefit the average consumer, as tailoring the power consumption within the home could lead to greater efficiency in power usage, possibly resulting in significant cost savings and environmental benefits.

Consumers who have knowledge of their power consumption would be able to adapt the use of a particular device or appliance in accordance with a prescribed 'cheap rate' interval (e.g. Economy 7), provided by the utility supplier, while providing the opportunity to identify any undesired power consumption by monitoring a 'residual' level of power usage due to devices or appliances being turned on unwillingly and or residing in stand-by modes etc.

An additional disadvantage of domestic meters is accessibility. Not all domestic meters reside within readily accessible locations within the home. Indeed, for flats and apartments in particular, domestic meters may be located externally to the residence and might only be accessible to authorised personnel despatched by the utility supplier.

In other situations, prohibited access to the domestic meter may lead the utility supplier to estimate billing charges based on a projected figure of power consumption, which may result in the consumer having to pay for more than has actually been consumed.

Additionally, accessibility may be a particular problem for the disabled and elderly who may not be able to physically locate and/or read the domestic meter and are thereby prevented from assessing the current or previous level of power consumption within the home.

An object of the present invention is to solve at least some or all of the above problems.

According to one aspect of the present invention there is provided a power consumption monitoring apparatus, comprising:

at least one electrical measurement device for generating a signal indicative of the electrical power passing through an electrical power line at the location of the measurement device;

at least one data controller adapted to receive the signal from the measurement device and to convert the signal into a data transmission stream conveying at least one power consumption statistic, the data controller including a transmitter for transmitting the data transmission stream across a communications medium; and a display controller including a receiver for receiving the stream from the communications medium, the display controller adapted to convert the stream into one or more data display transmission signals for reception by a variety of display devices to display power consumption statistics.

According to another aspect, the present invention provides a method of monitoring power consumption, comprising the steps of:

generating in at least one electrical measurement device, a signal indicative of the electrical power passing through an electrical power line at the location of the electrical measurement device;

receiving the signal from the measurement device at a data controller and converting the signal into a data transmission stream conveying at least one power consumption statistic;

transmitting the data transmission stream across a communications medium; and receiving the stream from the communications medium by a receiver in a display controller and converting the stream into one or more data display transmission signals for reception by a variety of display devices to display power consumption statistics.

Embodiments of the present invention will now be described by way of example and with reference to the accompanying drawings in which.

Figure 1:
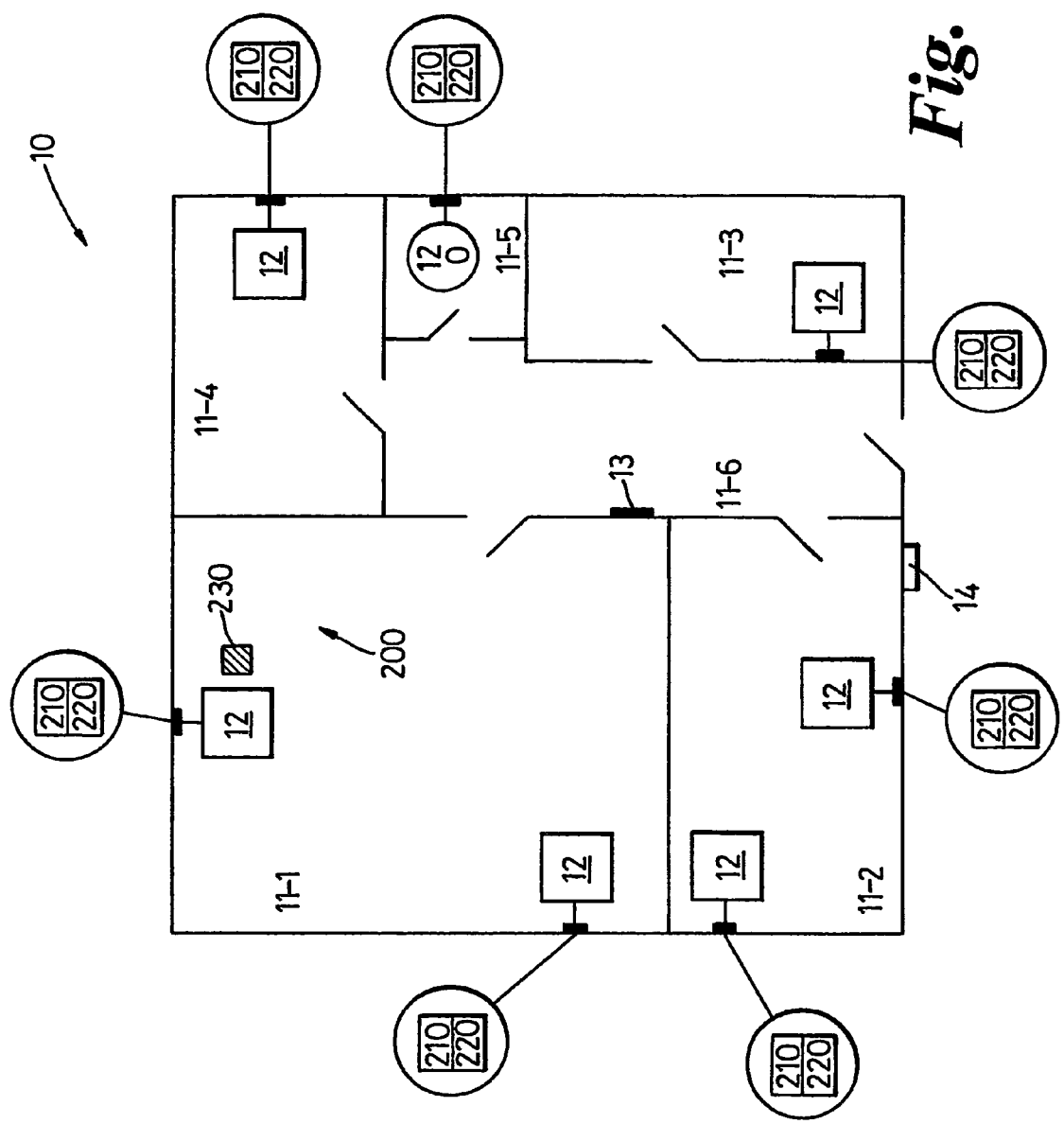
FIG. 1 shows a plan view of an average home including a power consumption monitoring apparatus according to a preferred embodiment of the present invention.

With reference to FIG. 1 there is shown a schematic view of one floor of an exemplary home 10, including several rooms 11-1 to 11-6, each including power consuming devices or appliances 12. The home 10 includes a conventional electrical mains network (not shown) and mains fuse box 13, through which electricity enters the home. Also shown is a mains fuse 14, located in a conventional position, either externally or internally, typically installed during electrical wiring of the home.

Figure 2:
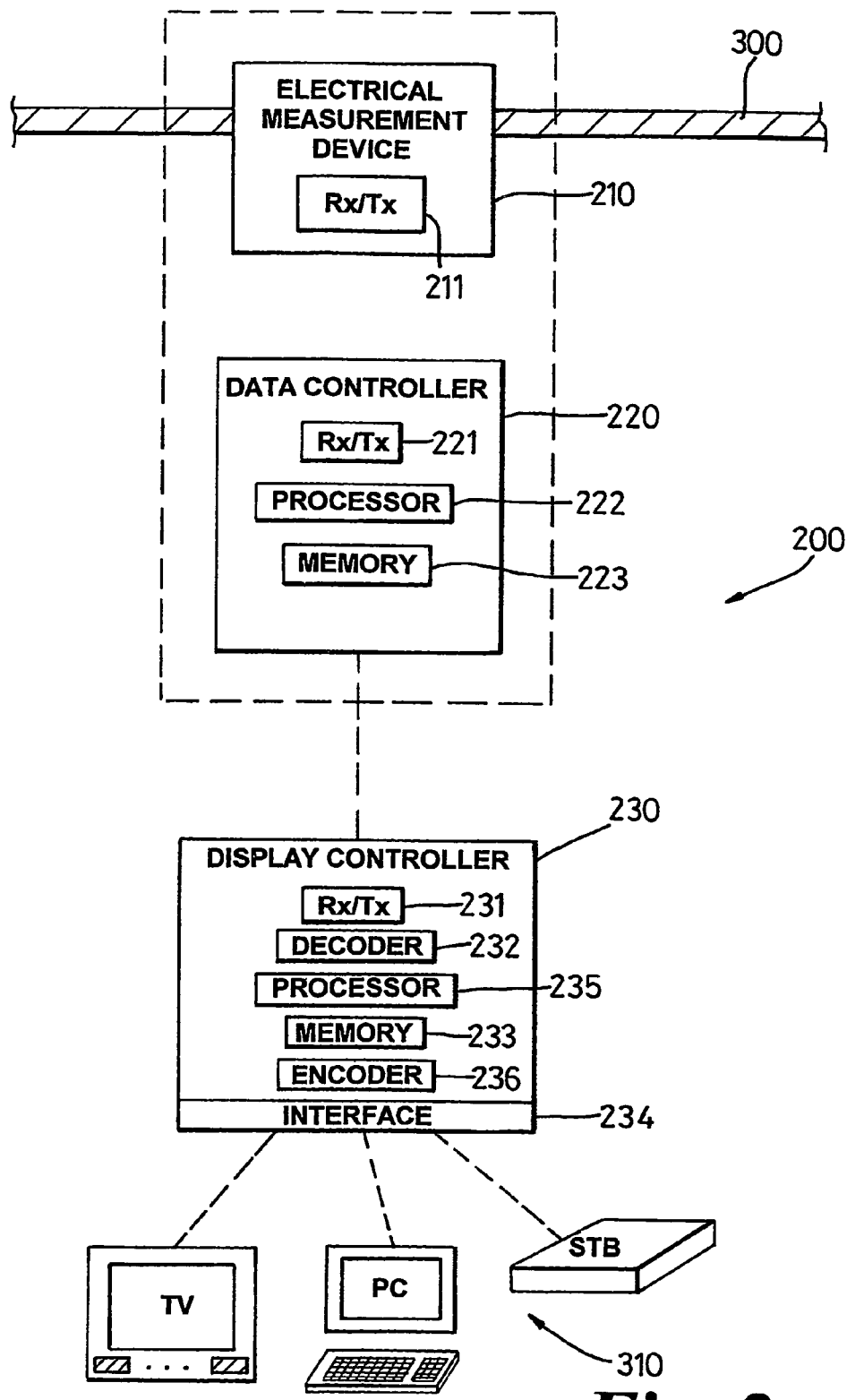
FIG. 2 shows a schematic representation of an embodiment of a power consumption monitoring apparatus.

Referring to FIGS. 1 and 2, there is shown a power consumption monitoring apparatus 200 according to a preferred embodiment of the present invention. The monitoring apparatus 200 comprises an electrical measurement device 210, a data controller 220 and a display controller 230.

In preferred embodiments, there would typically be one or more of each of these components in the home 10 depending upon the extent of monitoring desired by the consumer. In this respect, the monitoring apparatus 200 is advantageous, since the apparatus may be tailored to preferably monitor individual devices and appliances 12 or alternatively, may be configured to monitor the total power consumption of the home via the mains fuse 14.

The preferred embodiment in FIG. 1, shows a configuration in which the power consumption of individual devices and appliances 12 is monitored directly.

The electrical measurement device 210 is preferably positioned at the location of a conventional electrical power line 300, in order to generate a signal indicative of the electrical power passing through the electrical power line 300 at the location of the electrical measurement device 210.

In preferred embodiments the electrical measurement device 210 is either inserted into the electrical path of the electrical power line (i.e. in series with) or is attached to or coupled to the electrical power line using, but not limited to, a clip, clamp or other attachment means. The electrical measurement device 210 may use any conventional technique of measuring electricity, and in turn electrical power, including but not limited to, measuring voltage across a mains-rated load, inductive pick-up or capacitive means.

In a preferred embodiment, the electrical measurement device 210 is retrofitted to replace the mains fuse 14 in the mains electrical network. In this arrangement, the monitoring apparatus 200 would directly monitor the total power consumption within the home 10 environment. The consumer could deploy further electrical measurement devices 210 throughout the home if, in addition to the direct power monitoring, individual device and appliance 12 monitoring was also desired.

In another preferred embodiment, the electrical measurement device 210 is retrofitted to replace either the line fuses or circuit breaker assemblies (not shown) within the mains fuse box 13. In this arrangement, the power consumption of particular circuit rings could be monitored e.g. the ground floor lighting ring or first floor socket ring. Once again, the consumer may deploy further electrical measurement devices 210 throughout the home 10 if, in addition to the direct power monitoring, individual device and appliance 12 monitoring was also desired.

In a further preferred embodiment, the electrical measurement device 210 is adapted to be removeably inserted into a standard mains outlet socket (not shown). In this arrangement, direct power monitoring of individual device and appliances 12 is possible, with the total power consumption of the home 10 also capable of being monitored indirectly.

It will be appreciated that any one or more of the above configurations could be selected for a given home 10, depending upon the needs of the consumer and desired level of convenience with respect to installation and cost. For example, a configuration could be based on a retrofitted electrical measurement device 210 as a replacement to the mains fuse 14, to directly monitor the total power consumption of the home 10, with an electrical measurement device 210 replacing a line fuse to monitor the heating ring and an electrical measurement device 210 inserted into a mains socket to monitor an automatic washing machine.

In the preferred embodiment, the signal from the electrical measurement device 210 is received by the data controller 220. The preferred function of the data controller 220 is to convert the signal into a data transmission stream which conveys at least one power consumption statistic based on the electrical power passing through the electrical power line at the location of the electrical measurement device 210.

The electrical measurement device 210 and data controller 220 may be in different locations to each other, and may preferably be directly connected by electrical wiring or alternatively be connected by some form of hard-wired communications network.

In other embodiments, the data controller 220 may be connected to the mains electrical wiring and the electrical measurement device 210 and data controller 220 may communicate using conventional mains signalling techniques.

Alternatively, in further embodiments, the electrical measurement device and data controller may preferably include conventional transceivers 211, allowing signals to be communicated to the data controller preferably using wireless communications protocols (e.g. WiFi, Bluetooth).

In the preferred embodiment both the electrical measurement device 210 and data controller 220 are accommodated in the same unit (not shown) and may share the same circuit board.

In the preferred embodiment, the unit includes a standard mains connector (e.g. 2 or 3 pin plug) suitable for insertion into a standard mains outlet socket. The unit preferably also includes an outlet electrical socket suitable for receiving the standard mains connector of a power consuming device or appliance 12. In this arrangement, the electrical measurement device 210 would be in series with the electrical power line and device or appliance 12, and would monitor the electrical power drawn from the power line by the device or appliance 210.

In the preferred embodiment, the data controller 220 would be provided with electrical power via either an internal power source (e.g. a cell or battery) or the mains supply, in arrangements where the electrical measurement device 210 has a direct electrical connection to the mains or else through a dedicated power lead.

The data controller 220 may use any conventional technique or device to convert the signal from the electrical measurement device 210 into a data transmission stream. In particular, the data controller 220 may preferably include an analogue-to-digital converter (ADC) to convert the signals into numerical data, preferably comprising power consumption statistics.

In preferred embodiments, the data controller 220 includes a processor 222 and memory module 223 which stores re-calibration data should the DC suffer a power failure. Preferably, if a power failure is detected, the processor 222 will, upon power being restored, automatically execute the re-calibration routines stored in the memory module 223 and will preferably send a re-set signal to the associated electrical measurement device 210. The processor 222 may be any conventional IC-based processing device e.g. a PIC and the memory module 223 may be any conventional IC-based memory device e.g. a ROM.

In other embodiments, the data controller 220 may preferably include an auxiliary internal power source (not shown) which during operation would maintain a power supply to the DC for a predetermined interval of time should the primary power supply fail.

In preferred embodiments, the electrical measurement device 210 may include power interruption means (not shown) to interrupt the electrical power passing through the electrical power line 300. The means may be any conventional device which may controllably break an electrical circuit and may include, but is not limited to, a relay, a triac or another form of electromechanical or electronic switch. Preferably, the data controller 220 would send 'on' and 'off' control signals to the electrical measurement device 210 in a controlled manner and as directed by the user, using any of the communication techniques described in the previous embodiments. The control signals could be initiated manually or via an automatic sequence and could form part of an integrated strategic plan to minimise power usage and increase power consumption efficiency throughout the home 10. The data controller 220 could be set to instruct the electrical measurement device 210 to turn devices or appliances 12 on or off at certain times of the day or night in accordance with cheap-rate intervals as provided by the utility supplier.

In the preferred embodiments, the data transmission stream from the data controller 220 is received by a single display controller 230. The function of the display controller 230 is preferably to convert the stream into one or more data display transmission signals for reception by a variety of display devices to display power consumption statistics.

It will be appreciated that in embodiments where there is more than one data controller 220, the display controller 230 will receive as many data transmission streams as there are data controllers 220.

In other embodiments, there could be more than one display controller 230 either operating in conjunction with the other(s) or else each operating independently. In such embodiments for instance, one display controller 230 could be located on the ground floor of the home 10, while the other(s) could be located on the first floor of the home 10, with each providing data display transmission signals for display by a display device 310.

In embodiments having more than one display controller 230, the data transmission streams from the data controllers 220 could be encoded with a unique identifier which would allow the display controllers 230 to identify the particular data controllers 220 concerned and to accept only those streams selected by a given user e.g. a user in the front room of the home 10 might only want to see power consumption on that floor of the home 10.

In the embodiment shown in FIG. 1, there is one display controller 230 configured to receive the data transmission streams of the data controllers 220 deployed throughout the home 10. As shown in FIG. 1, the display controller 230 is preferably positioned at a different location to the locations of the data controllers and would be preferably located in proximity to the display device.

Preferably, the display controller 230 is powered by the mains supply and would may include a standard mains connector for insertion into a standard mains outlet socket. The display controller 230 may preferably include an auxiliary internal power source (not shown) which during operation would maintain a power supply to the display controller 230 for a predetermined interval of time should the primary power supply fail.

In the preferred embodiment, the display controller 230 and data controller(s) 220 include conventional transceivers 231, 221, allowing data transmission streams to be communicated to the display controller 230 preferably using wireless communications protocols (e.g. WiFi, Bluetooth).

In other embodiments, the display controller 230 and data controller(s) 220 may preferably be directly connected by electrical wiring or alternatively be connected by some form of hard-wired communications network. In such embodiments, the display controller 230 and data controller(s) 220 may communicate using conventional mains signalling techniques or network protocols respectively.

The display controller 230 preferably includes a data decoder 232, which receives the data transmission stream from the transceiver 231 and decodes the stream into numerical data containing power consumption statistics for the device or appliances 12 being monitored. The decoder 232 may be any conventional data decoder and may use any conventional technique for decoding the data transmission stream.

In the preferred embodiment, the display controller 230 receives multiple data transmission streams and converts each one into a numerical data-set time series for the particular device or appliance concerned.

Preferably, the display controller 230 includes a storage means 233 in the form of a memory module 233 into which the time series are recorded. The advantage of recording the power consumption statistics is that a historical data-set of power usage may be established for the particular device or appliance 12 concerned. Any conventional type of memory module may be used.

In preferred embodiments, the memory module 233 is of a type that includes non-volatile memory as a safe-guard against the display controller 230 suffering a power failure. Alternatively, an auxiliary internal power supply would preferably maintain power to the memory module 233 during a power failure, in order to preserve any historical data-set.

In other embodiments, the storage means may take the form of a conventional hard drive or other non-volatile storage device.

In preferred embodiments, the display controller 230 includes a processor 235 to calculate power usage statistics based on numerical data decoded in real-time or historical data or a combination of both. Preferably, statistical algorithms would be stored in either the non-volatile part of the memory module or else in a dedicated ROM chip. It will be appreciated that any conventional technique of storing the algorithms may be used, provided that the algorithms are preserved during a power failure of the display controller. Preferably, the processor 235 accesses the algorithms to calculate any desired power usage statistics.

In preferred embodiments, the display controller 230 encodes the power usage statistics using a conventional encoder 236 into one or more different data display transmission signals. The transmission signals are standard signal formats which are made available, via an interface 234, to the consumer for display on a suitable display device 310.

The interface 234 is may be any one or more of, but not limited to, the following interface types, a USB standard interface, RS232 standard interface, a UHF co-axial standard interface and a SCART standard interface.

The USB standard interface is of a type suitable for connection to the USB port on a personal computer and the RS232 standard interface is of a type suitable for connection to the serial port on a personal computer. The UHF co-axial standard interface is of a type suitable for connection to the UHF input socket on a television and the SCART standard interface is of a type suitable for connection to the SCART input socket on a television or set-top box.

In preferred embodiments, the interface 234 of the display controller 230 may include one or more ports dedicated to any of the standard interface types described.

If the consumer decides to interface the display controller 230 to a personal computer, the display device could be any conventional monitor e.g. VDU, TFT or LCD. In the case of interfacing the display controller 230 to either a UHF input socket or SCART input socket on a television or set-top box, the display device would be the television.

It will be appreciated that the described display devices 310 are examples only and any other display device capable of interfacing with the display controller 230 could be used. A particular advantage of the monitoring apparatus is that the above display devices 310 are readily accessible to most consumers and most own at least one or more of the example display devices 310.

In preferred embodiments which involve interfacing to a television via UHF or SCART input sockets, the transmission signal generated by the encoder 236, and made available at the UHF and SCART standard interfaces, is additionally encoded with graphical display instructions. The graphical display instructions can preferably be decoded by the television to display the power usage statistics conveyed by the transmission signal. Preferably, the graphical display instructions include at least a user interactive menu and/or a graphing window, in order to select desired power usage statistics and display both real-time and historical graphs of power usage.

In preferred embodiments involving interfacing to a personal computer via a USB or serial port, the transmission signal generated by the encoder 236, and made available at the USB and RS232 standard interfaces is preferably not encoded with graphical display instructions. The transmission signal in this instance preferably conveys power usage statistics which would be displayed using display software loaded onto the personal computer. The display software would preferably interrogate the relevant interface port and interpret the power usage statistics, providing at least a user interactive menu and/or a graphing window, in order to select desired power usage statistics and display both real-time and historical graphs of power usage.

In preferred embodiments, the display software may be coded so as to be compatible with most proprietary operating systems and hardware platforms.

In preferred embodiments, the interactive menu would be accessible via the display device 310 and could be operated using whatever control device the display device 310 receives instructions from e.g. for a television this would be the remote control unit and for a personal computer this would be the mouse, keyboard or other input device. Preferably, the display software would allow the consumer to configure the display so as to display only the desired power usage statistics and preferably would either show total power consumed within a prescribed interval, again configurable by the user, or power consumption for individual devices or appliances 12 and/or groups of devices and appliances.

The display software could preferably further provide the cost of total power consumed and/or individual costs for particular devices or appliances 12, which would advantageously allow the consumer to identify the current level of billing and the amount expended by individual devices and/or appliances.

It will be appreciated that the display software could be configured to show any desired real-time or historical power consumption data either conveyed by the transmission signals or stored by the display controller 230.

In preferred embodiments, the interactive menu of the display software could be used to instruct the display device 310, in particular, but not limited to, the personal computer or set-top box, to send a request for updated or historical power consumption data to the display controller 230 via the relevant interface port. Preferably, on receiving the request the processor 235 would either calculate the desired power consumption statistic or retrieve the required data from the memory module 233, or perform a combination of both operations, either singly or repeatedly.

In such preferred embodiments, the interactive menu could further be used to select the data controllers 220 monitoring particular devices or appliances 12, for instance, recalling the earlier example of a user in a front room of the home 10 wanting only to see power consumption on that floor of the home 10 etc.

A further use of the display software in such preferred embodiments, is for time setting of the on and off control signals sent by the data controller(s) 220 to the electrical measurement device(s) 210. In this arrangement, the time intervals could preferably be entered via the interactive menu, with request(s) being sent from the display controller 230 to the relevant data controller(s) 220 at the commencement of the desired time interval. The data controller(s) would then preferably send the relevant electrical measurement device 230 either an on or off signal to control the power interruption means.

Alternative embodiments could allow the selection of data controller(s) 220 or the setting of timing control signals to be performed by supplying instructions directly to the display controller 230 itself, via for example, switches or a touch-sensitive panel on the display controller 230 housing.

It will be recognised that the monitoring apparatus described herein has the considerable advantage that it is retrofittable to existing electrical networks and therefore offers an economical way of enabling consumers to monitor power consumption both in real-time and historically.

Although the described embodiment is ideal for monitoring power consumption within a domestic setting, it will be recognised that the principle can extend to other types of electrical networks and environments.

Other embodiments are intentionally within the scope of the appended claims.

The invention claimed is:

1. A power consumption monitoring apparatus, comprising:
   one or more electrical measurement device, each device adapted to generate a signal indicative of the electrical power passing through an electrical power line at the location of the measurement device;
   one or more data controllers, each adapted to receive a signal from an associated electrical measurement device and to convert the signal into a data transmission stream conveying at least one power consumption statistic, each data controller including a transmitter for transmitting the data transmission stream across a communications medium; and
   a remote display controller including a receiver for automatically receiving a plurality of said data transmission streams from the communications medium, the display controller being adapted to convert the power consumption statistics into one or more data display transmission signals, and including an interface compatible with and suitable for providing the data display transmission signals to a television display to thereby display power consumption statistics,
   wherein the or each electrical measurement device includes power interruption means for interrupting electrical power passing through the electrical power line; the each data controller is adapted to send on and off signals to the or each electrical measurement device to control the passage of electricity through the electrical power line; and
   the interface is compatible with, and adapter for, also communicating the data display transmission signals to a set top box.

2. The apparatus of claim 1, wherein the or each electrical measurement device is adapted to replace a main fuse in a mains network.

3. The apparatus of claim 1, wherein the or each electrical measurement device is adapted for either, insertion into, or attachment to, a mains fuse box.

4. The apparatus of claim 1, wherein the or each electrical measurement device is adapted for insertion into a mains outlet socket.

5. The apparatus of claim 4, wherein the or each data controller is integrated with the electrical measurement device.

6. The apparatus of claim 1, wherein the or each electrical measurement device includes an outlet socket adapted to receive a power consuming device.

7. The apparatus of claim 1, wherein the or each electrical measurement device and data controller are adapted to communicate using any one of mains signalling, wireless communication protocols or hard-wired network communications.

8. The apparatus of claim 7, wherein the or each electrical measurement device includes a transceiver for communicating signals to the data controller.

9. The apparatus of claim 1, wherein the or each data controller further includes a receiver for receiving signals from the electrical measurement means.

10. The apparatus of claim 1, wherein the or each data controller is adapted to automatically re-start time electrical measurement device if the data controller suffers a power failure.

11. The apparatus of claim 1, wherein the or each data controller and display controller are adapted to communicate using any one of the mains signaling, wireless communication protocols or hard-wired network communications.

12. The apparatus of claim 1, wherein the or each display controller includes a signal decoder to perform the conversion of the data transmission stream into the one or more data display transmission signals.

13. The apparatus of claim 1, wherein the interface is a UHF standard co-axial connector suitable for connection to a UHF input socket on a television.

14. The apparatus of claim 1, wherein the interface is a SCART standard interface suitable for connection to a SCART input socket on a television or set-top box.

15. The apparatus of claim 1, wherein the or each display controller further includes storage means adapted to record one or more power consumption statistics to form a set of historical power consumption data.

16. The apparatus of claim 15, wherein the or each display controller is adapted to generate one or more data display transmission signals which include historical power consumption data.

17. The apparatus of claim 15, wherein the or each display controller includes a processor to calculate power usage statistics based on historical power consumption data.

18. A method of monitoring power consumption, comprising the steps of:
    generating in each of one or more electrical measurement devices, a signal indicative of the electrical power passing through an electrical power line at the location of the electrical measurement device;
    receiving a signal from an associated electrical measurement device at each of one or more data controllers and converting the signal into a data transmission stream conveying at least one power consumption statistic;
    transmitting the one or more data transmission streams across a communications medium; and
    automatically receiving the one or more transmission streams from the communications medium by a receiver in a display controller;
    converting the power consumption statistics into one or more different data display transmission signals, and
    providing one or more data display transmission signals via an interface compatible with and suitable for providing the one or more data display transmission signals to a television display to thereby display the at least one power consumption statistic, and to a set box, the method further comprising the step of controlling the power interruption means in the or each electrical measurement device for interrupting electrical power passing through the electrical power line by sending on and off signals to the or each electrical measurement device from the or each data controller.

19. The method of claim 18, further comprising the step of communicating the signal from the or each electrical measurement device to the or each data controller using one of mains signaling, wireless communication protocols or hard-wired network communications.

20. The method of claim 18, further comprising the step of communicating the data transmission stream from the or each data controller to the display controller using one of mains signalling, wireless communication protocols or hard-wired network communications.

21. The method of claim 18, further comprising the step of supplying electrical power through an outlet socket of the or each electrical measurement device for an attached power consuming device.

22. The method of claim 18, further comprising the step of recording the power consumption statistics in a storage means to form a set of historical power consumption data.

23. The method of claim 18 or claim 22, further comprising the step of generating one or more data display transmission signals which include historical power consumption data.

24. The method of claim 18 or claim 22, further comprising the step of processing the historical power consumption data to calculate power usage statistics.

25. The method of claim 18, wherein the or each data controller automatically sends a re-start signal to the electrical measurement device in response to the data controller suffering a power failure.

* * * * *